United States Patent
Yamada et al.

(10) Patent No.: US 8,574,361 B2
(45) Date of Patent: Nov. 5, 2013

(54) GROUP-III ELEMENT NITRIDE CRYSTAL PRODUCING METHOD AND GROUP-III ELEMENT NITRIDE CRYSTAL

(75) Inventors: Osamu Yamada, Ehime (JP); Hisashi Minemoto, Osaka (JP); Kouichi Hiranaka, Ehime (JP); Takeshi Hatakeyama, Ehime (JP); Takatomo Sasaki, Osaka (JP); Yusuke Mori, Osaka (JP); Fumio Kawamura, Osaka (JP); Yasuo Kitaoka, Osaka (JP)

(73) Assignee: Ricoh Company, Ltd., Tokyo (JP)

( * ) Notice: Subject to any disclaimer, the term of this patent is extended or adjusted under 35 U.S.C. 154(b) by 902 days.

(21) Appl. No.: 12/524,811

(22) PCT Filed: Mar. 5, 2008

(86) PCT No.: PCT/JP2008/000444
§ 371 (c)(1),
(2), (4) Date: Jul. 28, 2009

(87) PCT Pub. No.: WO2008/111289
PCT Pub. Date: Sep. 18, 2008

(65) Prior Publication Data
US 2010/0078606 A1    Apr. 1, 2010
US 2011/0012070 A2    Jan. 20, 2011
US 2012/0168695 A2    Jul. 5, 2012

(30) Foreign Application Priority Data
Mar. 14, 2007 (JP) ................. 2007-065845

(51) Int. Cl.
*H01L 21/322* (2006.01)
(52) U.S. Cl.
USPC .......... 117/2; 117/3; 117/13; 117/19; 117/36; 117/68; 117/73; 117/77; 252/506; 252/519.14; 252/521.5; 257/40; 257/94; 438/483

(58) Field of Classification Search
USPC ........ 252/506, 519.14, 521.5; 117/13, 19, 36, 117/73, 77, 68, 3, 2; 257/98, 102, 103, 94, 257/40; 423/409; 438/483, 557
See application file for complete search history.

(56) References Cited

U.S. PATENT DOCUMENTS 7,063,741 B2    6/2006    D'Evelyn et al.
7,368,015 B2    5/2008    D'Evelyn et al.
(Continued)

FOREIGN PATENT DOCUMENTS

CN    1643187    7/2005
CN    1748290    3/2006
(Continued)

OTHER PUBLICATIONS

Chinese Office Action issued Apr. 21, 2011 in corresponding Chinese Patent Application No. 200880001092.8.
(Continued)

*Primary Examiner* — Khanh Tuan Nguyen
(74) *Attorney, Agent, or Firm* — Cooper & Dunham LLP

(57) ABSTRACT

A method for producing a high-quality group-III element nitride crystal at a high crystal growth rate, and a group-III element nitride crystal are provided. The method includes the steps of placing a group-III element, an alkali metal, and a seed crystal of group-III element nitride in a crystal growth vessel, pressurizing and heating the crystal growth vessel in an atmosphere of nitrogen-containing gas, and causing the group-III element and nitrogen to react with each other in a melt of the group-III element, the alkali metal and the nitrogen so that a group-III element nitride crystal is grown using the seed crystal as a nucleus. A hydrocarbon having a boiling point higher than the melting point of the alkali metal is added before the pressurization and heating of the crystal growth vessel.

12 Claims, 6 Drawing Sheets

(56) References Cited

U.S. PATENT DOCUMENTS

| | | |
|---|---|---|
| 7,488,384 B2 * | 2/2009 | Van Patten et al. ............... 117/3 |
| 7,641,880 B2 * | 1/2010 | Van Patten et al. ........... 423/409 |
| 2003/0183155 A1 | 10/2003 | D'Evelyn et al. |
| 2004/0124434 A1 | 7/2004 | D'Evelyn et al. |
| 2004/0262630 A1 | 12/2004 | Kitaoka et al. |
| 2005/0066878 A1 * | 3/2005 | Arent et al. ....................... 117/2 |
| 2005/0087753 A1 | 4/2005 | D'Evelyn et al. |
| 2005/0098095 A1 | 5/2005 | D'Evelyn et al. |
| 2006/0037529 A1 | 2/2006 | D'Evelyn et al. |
| 2006/0048699 A1 | 3/2006 | D'Evelyn et al. |
| 2006/0051942 A1 | 3/2006 | Sasaki et al. |
| 2006/0169197 A1 * | 8/2006 | Sasaki et al. ....................... 117/2 |
| 2006/0214161 A1 * | 9/2006 | Yanagihara et al. ............. 257/40 |
| 2007/0012943 A1 | 1/2007 | Okahisa et al. |
| 2007/0215887 A1 * | 9/2007 | D'Evelyn et al. ............... 257/94 |
| 2008/0302297 A1 * | 12/2008 | Ichimura et al. ................ 117/73 |
| 2010/0059717 A1 | 3/2010 | Mori et al. |

FOREIGN PATENT DOCUMENTS

| | | |
|---|---|---|
| EP | 1 548 160 | 6/2003 |
| EP | 1 490 537 | 4/2011 |
| JP | 2002-293696 | 10/2002 |
| JP | 2003-292400 | * 10/2003 |
| JP | 2003-300798 | 10/2003 |
| WO | 03/083187 | 10/2003 |
| WO | 2004/013385 | 2/2004 |
| WO | 2004/061923 | 7/2004 |
| WO | WO 2007-094126 A1 * | 8/2007 |

OTHER PUBLICATIONS

M. Lu et al., "Recovery and Utilization of Metal Sodium Outer Layer," Experimental Technology and Management, vol. 21, No. 6, Dec. 31, 2004, pp. 13-14 and English Translation.

Supplemental European Search Report issued Jul. 6, 2011 in International (PCT) Application No. PCT/JP2008/000444.

International Search Report issued May 27, 2008 in the International (PCT) Application of which the present application is the U.S. National Stage PCT/JP2008/000444.

Y. Oshima et al., "Thermal and optical properties of bulk GaN crystals fabricated through hydride vapor phase epitaxy with void-assisted separation", Journal of Applied Physics, vol. 98, pp. 103509-1-103509-4, 2005.

Y. Mori et al., "Na Flux LPE-ho ni yoru Ogata Kohinshitsu GaN Kessho Ikusei", Hyomen Kagaku Kenkyukai Yokoshu, vol. 55, pp. 16-21, Dec. 2007, (partial translation enclosed).

Chinese Office Action issued Feb. 22, 2012 in corresponding Chinese Application No. 200880001092.8.

Office Action issued Oct. 18, 2011 in U.S. Appl. No. 12/514,836.

Response dated Aug. 24, 2011 to the Office Action issued Feb. 24, 2011 in U.S. Appl. No. 12/514,836.

* cited by examiner

GROUP-III ELEMENT NITRIDE CRYSTAL PRODUCING METHOD AND GROUP-III ELEMENT NITRIDE CRYSTAL

This application is a U.S. national stage of International Application No. PCT/JP2008/000444 filed Mar. 5, 2008.

TECHNICAL FIELD

The present invention relates to a group-III element nitride crystal producing method and a group-III element nitride crystal.

BACKGROUND ART

Group-III element nitride compound semiconductors, such as gallium nitride (GaN) and the like, have attracted attention as materials for semiconductor devices that emit blue or ultraviolet light. Blue laser diodes (LDs) are applied to high-density optical discs and displays, and blue light emitting diodes (LEDs) are applied to displays, lights and the like. Ultraviolet LDs are expected to be applied to biotechnology and the like, and ultraviolet LEDs are expected to provide ultraviolet light for fluorescent lamps.

A substrate made of a group-III element nitride compound semiconductor, such as gallium nitride (GaN) or the like, for an LD or an LED is typically produced by heteroepitaxially growing a group-III element nitride crystal on a sapphire substrate using vapor phase epitaxy. Examples of vapor phase epitaxy include Metal Organic Chemical Vapor Deposition (MOCVD), Hydride Vapor Phase Epitaxy (HYPE), Molecular Beam Epitaxy (MBE), and the like. However, the dislocation density of a gallium nitride crystal obtained by these vapor phase epitaxy methods is $10^8$ cm$^{-2}$ to $10^9$ cm$^2$, which is poor crystal quality. To avoid this problem, ELOG (Epitaxial Lateral Overgrowth) has been developed, for example. This method can reduce the dislocation density to about $10^5$ cm$^{-2}$ to $10^6$ cm$^2$. However, this method disadvantageously includes a complicated step.

On the other hand, crystal growth may be carried out in liquid phase instead of vapor phase epitaxy. Since the nitrogen equilibrium vapor pressure at the melting point of a group-III element nitride single crystal, such as gallium nitride (GaN), aluminum nitride (AlN) or the like, is 10000 atm or more, liquid phase growth of a group-III element, such as a gallium nitride crystal, an aluminum nitride crystal or the like, needs to be conducted under severe conditions, such as at 1200° C. at 8000 atm (8000×1.013×10$^5$ Pa).

To solve this problem, a method of using an alkali metal, such as sodium (Na) or the like, as a flux has been recently developed. This method allows a group-III element nitride crystal, such as a gallium nitride crystal, an aluminum nitride crystal or the like, to be obtained under relatively mild conditions. As an example, in a nitrogen gas atmosphere containing ammonia, sodium (alkali metal) and gallium (group-III element) are melted by application of pressure and heat, and the melt (sodium flux) is used to conduct crystal growth for 96 hours to obtain a gallium nitride crystal having a maximum crystal size of about 1.2 mm (see, for example, Patent Citation 1). Also, a method in which a reaction vessel and a crystal growth vessel are separated and a large crystal is grown while suppressing spontaneous nucleation has been proposed (see, for example, Patent Citation 2). Also, a method of growing a high-quality bulk crystal, where an alkaline earth metal or the like is added to sodium, has been proposed (see, for example, Patent Citation 3).

A gallium nitride crystal obtained by the method of using a sodium flux has a low dislocation density (i.e., high quality), but a low growth rate (i.e., poor productivity) as compared to when vapor phase epitaxy is employed. Therefore, an improvement in growth rate is required for the method of producing a gallium nitride crystal in liquid phase, where an alkali metal, such as sodium or the like, is used as a flux.

Patent Citation 1: JP 2002-293696 A
Patent Citation 2: JP 2003-300798 A
Patent Citation 3: WO04/013385

DISCLOSURE OF INVENTION

In the method of producing a group-III element nitride crystal using an alkali metal as a flux, it is important to efficiently dissolve nitrogen in the flux so as to improve the growth rate. To achieve this, it is necessary to cause both the temperature of the flux and the pressure of nitrogen-containing gas (atmosphere gas) to be higher so as to increase the amount of nitrogen dissolved in flux. However, when the temperature and the pressure are high, the supersaturation degree of nitrogen in the flux increases near the gas-liquid interface between the atmosphere gas and the flux, so that nonuniform nucleation easily occurs. If nonuniform nucleation occurs at the gas-liquid interface, a polycrystal of group-III element nitride is grown as miscellaneous crystals (so-called nonuniform nucleation) based on the nuclei. Therefore, crystal growth that would otherwise occur on a seed crystal is suppressed, disadvantageously resulting in a reduction in growth rate.

Therefore, an object of the present invention is to provide a method for producing a group-III element nitride crystal, in which a crystal growth rate can be improved by suppressing the occurrence of miscellaneous crystals.

To achieve the object, a method for producing a group-III element nitride crystal according to the present invention includes the steps of adding a hydrocarbon having a boiling point higher than the melting point of an alkali metal to a crystal growth vessel containing a group-III element, an alkali metal, and a seed crystal of group-III element nitride, pressurizing and heating the crystal growth vessel in an atmosphere of nitrogen-containing gas, and causing the group-III element and nitrogen to react with each other in a melt of the group-III element, the alkali metal and the nitrogen so that a group-III element nitride crystal is grown using the seed crystal as a nucleus.

Also, a group-III element nitride crystal according to the present invention is one that has an optical absorption coefficient of 10 cm$^4$ or less with respect to light having a wavelength of 400 nm or more and 620 nm or less and is produced by the above-described method.

A semiconductor device formation substrate according to the present invention includes the group-III element nitride crystal of the present invention.

Moreover, a semiconductor device according to the present invention is such that a semiconductor layer is formed on the substrate of the present invention.

By adding a hydrocarbon having a specific boiling point to the flux during the growth of a group-III element nitride crystal using an alkali metal flux, nonuniform nucleation can be suppressed. Thereby, it is possible to efficiently grow a group-III element nitride crystal at higher temperatures and higher pressures. As a result, the crystal growth rate can be improved. Also, by coating the alkali metal with a hydrocarbon, it is possible to suppress reaction of the alkali metal with oxygen and water in an atmosphere. Further, by adding a hydrocarbon, the film thickness of a grown crystal can be uniform. As a result, the quality of the group-III element nitride crystal can be improved as well. The production method of the present invention is effective to general group-III element nitride crystals, and is particularly effective when the alkali metal is sodium and the group-III element nitride crystal is a gallium nitride crystal.

EXPLANATION OF REFERENCE

Figure 1A:
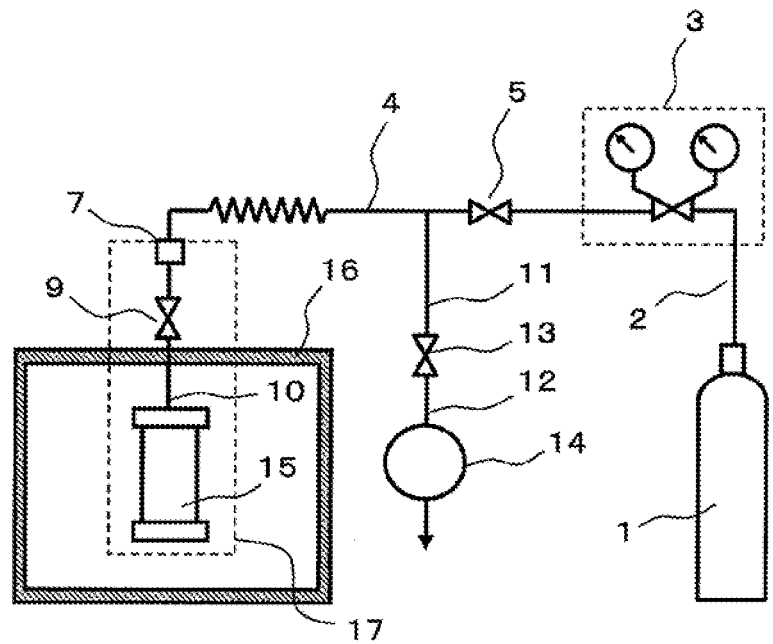
FIG. 1(a) is a diagram showing an exemplary configuration of a production apparatus for use in a production method according to the present invention.

| 1 | gas supply apparatus |
|---|---|
| 2 | pipe |
| 3 | pressure adjuster |
| 4 | pipe |
| 5 | valve |
| 7 | joint |
| 9 | valve |
| 10 | heat-resistant pipe |
| 11 | pipe |
| 12 | pipe |
| 13 | valve |
| 14 | exhaust apparatus |
| 15 | closed pressure-resistant and heat-resistant vessel |
| 16 | heating apparatus |
| 17 | reaction vessel |
| 18 | crystal growth vessel |
| 20 | seed crystal |
| 21 | flux |
| 30 | gallium nitride crystal |
| 31 | miscellaneous crystals |
| 32 | gallium nitride crystal |
| 60 | high-pressure chamber |
| 61 | high-pressure chamber lid |
| 62 | gas flow rate adjuster |
| 64 | joint |
| 65 | gas inlet-side valve |
| 66 | gas outlet-side valve |
| 68 | pressure adjuster |
| 70 | heater |
| 72 | heat insulator |
| 80 | reaction vessel |
| 82 | crystal growth vessel |
| 84 | sodium |
| 86 | gallium |
| 88 | seed |
| 100 | holding substrate |
| 102 | seed layer |
| 104 | grown crystal |
| 106 | self-sustaining substrate |
| 108 | grown crystal |
| 110 | self-sustaining substrate |

BEST MODE FOR CARRYING OUT THE INVENTION

A method for producing a group-III element nitride crystal according to the present invention is performed as follows. A group-III element, an alkali metal, and a seed crystal of group-III element nitride are placed in a crystal growth vessel, to which a hydrocarbon having a boiling point higher than the melting point of the alkali metal is then added. The crystal growth vessel is pressurized and heated in a nitrogen-containing gas atmosphere so that the group-III element and nitrogen are caused to react with each other in the melt containing the group-III element, the alkali metal and nitrogen. As a result, a group-III element nitride crystal is grown on the seed crystal as a nucleus. In particular, the alkali metal is preferably coated with a hydrocarbon, and the alkali metal coated with the hydrocarbon is preferably added to the crystal growth vessel.

In the present invention, the group-III element is gallium (Ga), aluminum (Al) or indium (In), particularly preferably gallium (Ga). The group-III element nitride is, for example, aluminum nitride (AlN), indium nitride (InN), gallium nitride (GaN) or the like, particularly desirably gallium nitride (GaN). The alkali metal is lithium (Li), sodium (Na), potassium (K), rubidium (Rb), cesium (Cs) or francium (Fr), particularly desirably sodium (Na). These alkali metals may be used singly or in combination of two or more. In this case, the major alkali metal component is desirably sodium. As a flux component, an alkaline earth metal may be used. The alkaline earth metal is, for example, Mg, Ca, Sr or Ba. A dopant may also be added to the flux. An n-type dopant is, for example, Si, Ge, Sn or O. A p-type dopant is, for example, Mg, Ca, Sr, Ba or Zn. The amount of the dopant in the obtained crystal falls within the range of $1\times10^{15}$ to $1\times10^{19}$ cm$^3$, for example.

Hereinafter, an embodiment of the production method of the present invention will be described, assuming that the alkali metal is sodium (Na), the group-III element is gallium (Ga), and the group-III element nitride crystal is gallium nitride (GaN). Note that a group-III element nitride crystal other than gallium nitride may also be used and may be produced with reference to the following description.

(Embodiment 1)

In this embodiment, a method for producing a gallium nitride crystal will be described in which a seed crystal, sodium, gallium, and a hydrocarbon are placed in a crystal growth vessel for holding a sodium flux, and thereafter, nitrogen-containing gas is pressurized and the crystal growth vessel is heated to melt sodium and gallium, thereby generating a sodium flux.

Figure 1B:
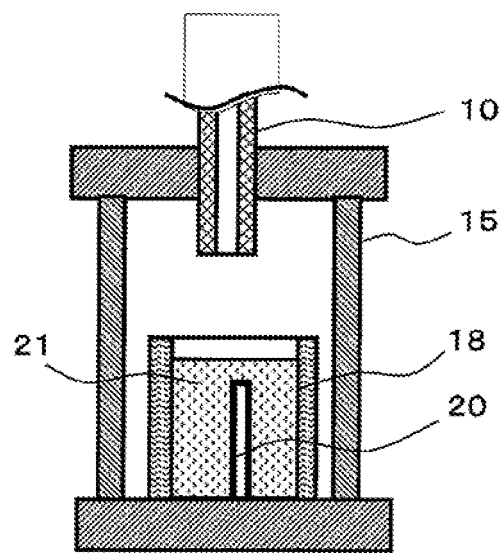
FIG. 1(b) is a diagram showing an exemplary closed pressure-resistant and heat-resistant vessel for use in the production method of the present invention.

An exemplary configuration of a production apparatus that is employed in the production method of the present invention is shown in FIG. 1(a). An exemplary closed pressure-resistant and heat-resistant vessel for use in the production method of the present invention is shown in FIG. 1(b).

The apparatus of FIG. 1(a) comprises a gas supply apparatus 1 for supplying material gas, a pressure adjuster 3 for adjusting the pressure of the material gas, a closed pressure-resistant and heat-resistant vessel 15 for conducting crystal growth, a heating apparatus 16 for heating, and an exhaust apparatus 14.

The gas supply apparatus 1, which is filled with nitrogen-containing gas as the material gas, is connected via a pipe 2 to a pressure adjuster 3.

The pressure adjuster 3, which has a function of adjusting the material gas into an optimal gas pressure, is connected via a pipe 4 and a valve 5 to a detachable joint 7. Also, a portion of the pipe 4 (portion indicated with a wavy line) is formed of a pressure-resistant flexible hose, thereby enabling it to freely change the position and the direction of the joint 7. Moreover, the pipe 4 branches into a pipe 11 at an intermediate portion thereof. The pipe 11 is connected via a valve 13 and a pipe 12 to the exhaust apparatus 14.

On the other hand, a reaction vessel 17 having a valve 9, a heat-resistant pipe 10 and the closed pressure-resistant and heat-resistant vessel 15 is connected to the joint 7. Note that the reaction vessel 17 is detachably connected to the joint 7.

As the heating apparatus 16, an electric furnace including a heat insulator and a heater can be used, for example. Also, the heating apparatus 16 preferably performs a temperature control so that the temperature of the closed pressure-resistant and heat-resistant vessel 15 and a portion within the heating apparatus 16 of the heat-resistant pipe 10 is maintained uniform, particularly in terms of prevention of aggregation of the sodium flux. Temperature in the heating apparatus 16 can be controlled to, for example, 600° C. (873 K) to 1100° C. (1373 K). The pressure adjuster 3 can control the nitrogen-containing gas within the range of 100 atm (10× $1.01325 \times 10^5$ Pa) or less. The heating apparatus 16 also has a shaking function. The closed pressure-resistant and heat-resistant vessel 15 can be fixed to the heating apparatus 16 so as to be shaken.

FIG. 1(b) shows a configuration of the closed pressure-resistant and heat-resistant vessel 15. A crystal growth vessel 18 is provided in the closed pressure-resistant and heat-resistant vessel 15. A seed crystal 20 is vertically arranged in the crystal growth vessel 18. The crystal growth vessel 18 is filled with a flux 21 of melted gallium (Ga) and sodium (Na). The seed crystal 20 may be horizontally arranged on a bottom of the crystal growth vessel 18 instead of the vertical arrangement as shown in the figure. Note that, in the case of the bottom arrangement, a surface of the seed crystal 20 on which crystal growth is conducted needs to be caused to face upward.

Examples of a material for the crystal growth vessel 18 include, but are not particularly limited to, alumina ($Al_2O_3$), yttria ($Y_2O_3$), BN, PBN, MgO, CaO, W, SiC, carbon materials (graphite, diamond-like carbon, etc.), and the like. Particularly, yttria or alumina, which hinders dissolution of oxygen and aluminum into the flux even at high temperatures, preferably enables growth of a gallium nitride crystal including less impurities.

Examples of a material for the closed pressure-resistant and heat-resistant vessel 15 include SUS materials (SUS316, etc.), nickel alloys (Inconel, Hastelloy, Incoloy, etc.), and the like, which are resistant to high temperatures. In particular, materials, such as Inconel, Hastelloy, Incoloy and the like, are resistant to oxidation at high temperatures and high pressures, and can also be used in atmospheres other than inert gas, and are preferable in terms of reusability and durability.

Next, production of a gallium nitride crystal using the production apparatus described above will be described.

Initially, sodium and gallium as materials and the seed crystal 20 as a nucleus (template) for crystal growth are placed in the crystal growth vessel 18.

In the present invention, sodium as a material is desirably of high purity in terms of the suppression of nonuniform nucleation and the high quality of a crystal. Specifically, the purity is 99% or more, more preferably 99.95% or more. The purity of gallium is similarly preferably 99% or more, more preferably 99.9% or more. The mass ratio (Na:Ga) of sodium (Na) and gallium (Ga) is preferably within the range of Na:Ga=4:1 to 1:4, more preferably Na:Ga=2:1 to 1:2, taking the solubility of nitrogen into consideration. The total amount of sodium and gallium is set such that the range of the depth of the seed crystal 20 from a liquid surface of the flux 21 in the crystal growth vessel 18 has a predetermined value. The range of the depth from the liquid surface of the flux 21 to the seed crystal 20 is preferably 0 mm to 40 mm, more preferably 2 mm to 20 mm.

In the present invention, the seed crystal may be any of a single crystal, a polycrystal, and an amorphous substance, though a single crystal or an amorphous substance is desirable. The form of the nucleus is not particularly limited and is desirably a single-crystal substrate of gallium nitride or a thin film substrate of gallium nitride, for example. The thin film substrate of gallium nitride is provided by forming a gallium nitride thin film on a substrate made of sapphire using, for example, Metal Organic Chemical Vapor Deposition (MOCVD), Hydride Vapor Phase Epitaxy (HYPE), Molecular Beam Epitaxy (MBE), or the like. The gallium nitride thin film preferably has a thickness of 5 μm or more, more preferably 10 μm or more. This is because when the temperature of the flux exceeds 700° C. as temperature increases, the amount of nitrogen that can be dissolved rapidly increases and surpasses the supply of nitrogen from the atmosphere gas. As a result, there is an extreme shortage of nitrogen in the flux, so that gallium nitride of the seed crystal is extremely dissolved (excessive meltback). Therefore, the gallium nitride thin film preferably has a large thickness.

Next, a hydrocarbon is added to the crystal growth vessel 18. The hydrocarbon is preferably liquid, solid or a mixture of liquid and solid at room temperature (e.g., 25° C.). In the present invention, the hydrocarbon is preferably, for example, a chain saturated hydrocarbon, a chain unsaturated hydrocarbon, an alicyclic hydrocarbon, an aromatic hydrocarbon or the like, or a mixture thereof. The hydrocarbon also preferably does not contain oxygen, so as to prevent oxidation of an alkali metal. Note that since the hydrocarbon evaporates in the step of heating the crystal growth vessel 18 to generate a flux, the hydrocarbon preferably has a high boiling point. The boiling point of the hydrocarbon is suitably higher than or equal to the boiling point of the alkali metal. As used herein, "the boiling point of the hydrocarbon is higher than or equal to the melting point of the alkali metal" means that when there are two or more alkali metals, the boiling point of the hydrocarbon is higher than or equal to the melting point of at least one of the two or more alkali metals.

For example, the boiling point of the hydrocarbon is higher than or equal to 97.7° C., which is the melting point of sodium, preferably 150° C. or more, and more preferably 300° C. or more. In the present invention, the hydrocarbon is, for example, kerosenes having a boiling point of 150° C. or more, paraffins having a boiling point of 300° C. or more (e.g., heptadecane (boiling point: 302° C.), octadecane (boiling point: 317° C.), nanodecane (boiling point: 330° C.), icosane (boiling point: 342° C.), triacontane (boiling point: 449.8° C.), vaseline (boiling point: 302° C.), liquid paraffins (boiling point: 170 to 340° C.), and solid paraffins (boiling point: 300° C. or more)), lamp oils having a boiling point of 150 to 250° C., biphenyl (boiling point: 254° C.), o-xylene (boiling point: 144° C.), m-xylene (boiling point: 139° C.), p-xylene (boiling point: 138° C.), cumene (boiling point: 153° C.), ethyltoluenes (boiling point: 161 to 165° C.), cymene (boiling point: 177° C.), tetralin (boiling point: 208°

C.), or the like. These may be used singly or in combination of two or more. Of these hydrocarbons, octadecane, nanodecane, icosane, triacontane, solid paraffin and biphenyl are solid at room temperature. Heptadecane having a boiling point of 300° C. or more, liquid paraffins, kerosines having a boiling point of 150° C. or more, lamp oils having a boiling point of 150 to 250° C., o-xylene, m-xylene, p-xylene, cumene, ethyltoluene, cymene, and tetralin are liquid at room temperature. Of these hydrocarbons, liquid paraffins are preferable, which have a low vapor pressure at room temperature and are liquid and therefore easy to weigh.

The lower limit of the amount of the hydrocarbon added is preferably 0.03 parts by mass (%) or more, more preferably 0.05 parts by mass (%) or more, per 100 parts by mass of an alkali metal (e.g., sodium).

The upper limit of the amount of the hydrocarbon added is preferably determined as appropriate, when a single crystal of gallium nitride is used as a seed crystal and when a thin film substrate of gallium nitride is used.

When a single crystal of gallium nitride is used as a seed crystal, the amount of the hydrocarbon added is preferably, but is not particularly limited to, one part by mass (%) or less per 100 parts by mass of sodium. If the amount of the hydrocarbon added exceeds 1%, a reduction in quality, such as an increase in defect or coloration of gallium nitride crystal or the like, is likely to occur.

On the other hand, when a thin film substrate is used as a seed crystal (e.g., a thin film substrate made of gallium nitride having a thickness of about 10 μm is used, the upper limit of the amount of the hydrocarbon added is preferably 0.6 parts by mass (%) or less, more preferably 0.4 parts by mass (%) or less, per 100 parts by mass of an alkali metal (e.g., sodium). This is because the hydrocarbon promotes meltback. Note that "meltback" means that when the temperature of the sodium flux increases during an initial period of crystal growth, the amount of nitrogen that can be dissolved in the sodium flux rapidly increases, whereas the dissolution of nitrogen into the sodium flux is slowed down, so that gallium nitride is dissolved from the seed crystal. If the amount of dissolved nitrogen is thus large, then when, for example, a thin film crystal is used as a seed crystal, the seed may be dissolved and lost (excessive dissolution or excessive meltback). Therefore, when a thin film substrate of gallium nitride is used as a seed crystal, the amount of the hydrocarbon is preferably set to fall within the range described above. Note that when the gallium nitride thin film has a thickness of more than 10 μm, the upper limit of the amount of the hydrocarbon added is preferably increased in substantially proportion to the thickness of the thin film. When the gallium nitride has a thickness of less than 10 μm, the upper limit is preferably decreased in proportion to the thickness.

Next, the crystal growth vessel 18 is placed in the closed pressure-resistant and heat-resistant vessel 15, and then the closed pressure-resistant and heat-resistant vessel 15, the valve 9 and the pipe 10 are assembled into the reaction vessel 17, which is then connected to the joint 7. Thereafter, the valve 9 is closed so as to prevent entry of atmosphere gas. These preliminary steps are preferably conducted in an atmosphere of inert gas (e.g., nitrogen gas, argon, etc.) whose oxygen concentration and water content are controlled, so as to suppress oxidation and hydroxylation of sodium. The oxygen concentration of the inert gas is preferably 5 ppm or less, more preferably 1 ppm or less. The water content (by volume) of the inert gas is preferably 3 ppm or less, more preferably 0.5 ppm or less. Particularly, more preferably, the gas atmosphere has an oxygen concentration of 1 ppm or less and a water content (by volume) of 0.5 ppm or less. In this case, oxidation and hydroxylation of sodium surface can be hindered for several hours.

Next, the reaction vessel 17 is removed from the inert gas atmosphere, the closed pressure-resistant and heat-resistant vessel 15 is placed in the heating apparatus 16, and the joint 7 is connected to the pipe 4. Thereafter, the valve 13 is opened, and the exhaust apparatus 14 is used to remove gas from the closed pressure-resistant and heat-resistant vessel 15 through the pipe 4. After the end of the gas removal, the valve 13 is closed and the valve 5 and the valve 9 are opened, so that the inside of the closed pressure-resistant and heat-resistant vessel 15 is pressurized with nitrogen-containing gas from the gas supply apparatus 1. Note that the applied pressure is adjusted by the pressure adjuster 3.

Next, the closed pressure-resistant and heat-resistant vessel 15 is heated by the heating apparatus 16 to melt sodium and gallium in the crystal growth vessel 18, thereby generating a sodium flux. Thereafter, after a lapse of about 10 to 30 hours, dissolution of nitrogen in the sodium flux reaches supersaturation. Thereby, gallium nitride crystal is deposited on the seed crystal 20. Further, by continuing heating and pressurization for a predetermined time, gallium nitride crystal is further grown. When about 70% to 95% of gallium supplied as a material has been deposited as gallium nitride crystal, the seed crystal 20 is removed from the crystal growth vessel 18.

Here, the heating conditions are appropriately determined, depending on a component of the flux and a component of the atmosphere gas and its pressure. For example, the heating temperature is within the range of 700° C. (973 K) to 1100° C. (1373 K), preferably the range of 800° C. (1073 K) to 1000° C. (1273 K). For example, the pressurization conditions are 2 atm ($2 \times 1.01325 \times 10^5$ Pa) or more, preferably 20 atm ($20 \times 1.01325 \times 10^5$ Pa) or more. The upper limit of the pressurization conditions is preferably 100 atm ($100 \times 1.01325 \times 10^5$ Pa) or less.

The nitrogen-containing gas is, for example, nitrogen gas ($N_2$), ammonia gas ($NH_3$) or the like, which may or may not be mixed (the mixture ratio is not limited). In particular, the use of ammonia gas is preferable since a reaction pressure can be reduced. Also, the nitrogen-containing gas preferably has a low oxygen concentration and a low water content so as to suppress oxidation and hydroxylation of the flux. The oxygen concentration of the nitrogen-containing gas is preferably 5 ppm or less, more preferably 1 ppm or less. The water content (by volume) of the nitrogen-containing gas is preferably 3 ppm or less, more preferably 0.1 ppm or less.

Note that the principle of the effect of suppressing nonuniform nucleation by addition of a hydrocarbon is as follows. The hydrocarbon is broken down to carbon and hydrogen in the flux. Carbon in the flux is easily coupled with nitrogen to form a cyanide ion. Therefore, the amount of nitrogen that can be dissolved in the flux increases, and nitrogen is diffused due to convection in the flux near the gas-liquid interface without reaching excessive supersaturation. On the other hand, hydrogen in the flux acts to break down gallium nitride at high temperatures as is similar to when it is in gas. Therefore, hydrogen invariably breaks down the seed crystal of gallium nitride or nucleated gallium nitride. In particular, a small gallium nitride immediately after nucleation has an excessively large surface area as compared to its volume, and therefore, is more effectively broken down or extinguished. Thus, carbon and hydrogen allow relaxation of excessive supersaturation near the gas-liquid interface of the flux or the like. Moreover, due to hydrogen, gallium nitride immediately after nucleation cannot grow and is broken down. It can be considered that, as their synergetic effect, the occurrence of miscellaneous crystals near the gas-liquid interface can be suppressed, and in addition, the film thickness of gallium nitride grown on the seed crystal is caused to be more uniform.

(Embodiment 2)

In this embodiment, a method for producing gallium nitride will be described in which a seed crystal, sodium (alkali metal) coated with a hydrocarbon, gallium (group-III element), and a hydrocarbon are placed in a crystal growth vessel for holding a sodium flux that is an alkali metal, and thereafter, a portion of the hydrocarbon is removed, followed by heating of the crystal growth vessel.

In this production method, further, the amount of the hydrocarbon in the crystal growth vessel is preferably adjusted. For example, the suppression of nucleation and the coating of the alkali metal require different amounts of the hydrocarbon. Therefore, the hydrocarbon may be added in an amount required for the coating of the alkali metal in a preliminary step, and the amount of the hydrocarbon may be adjusted within an appropriate range so as to prevent dissolution of the seed crystal in an adjustment step. The adjustment of the amount of the hydrocarbon includes, for example, removal or addition of the hydrocarbon.

An exemplary production apparatus for use in the production method of the present invention is similar to that of FIGS. 1(a) and 1(b) described in Embodiment 1. A procedure for producing a gallium nitride crystal using this production apparatus will be described.

Initially, sodium and gallium as materials and a seed crystal as a nucleus (template) for crystal growth are placed in the crystal growth vessel 18. Here, sodium that is coated in advance with a hydrocarbon is used. Sodium is coated with a hydrocarbon as follows. For example, sodium from which oxidized and hydroxylated portions thereof have been removed may be immersed in a liquid hydrocarbon and then pulled out. Alternatively, a hydrocarbon that is solid at room temperature may be heated in advance to be melted, and then sodium may be immersed in the melt and then pulled out, and the temperature of the hydrocarbon may be then returned to room temperature so that the hydrocarbon is solidified. Also, a liquid hydrocarbon and a solid hydrocarbon may be mixed.

In the present invention, the boiling point of a hydrocarbon used for coating is preferably sufficiently higher than room temperature so as to maintain the effect of preventing oxidation and hydroxylation of sodium at room temperature in addition to the reason of Embodiment 1. Specifically, the boiling point of the hydrocarbon is higher than or equal to 97.7° C. that is the melting point of sodium, more preferably 150° C. or more, and even more preferably 300° C. or more. Examples of the hydrocarbon include hydrocarbons similar to those described in Embodiment 1.

If the mass of the hydrocarbon for coating sodium is excessively large, a reduction in quality, such as an increase in defect, coloration of gallium nitride crystal or the like, is likely to occur. As a guideline, one part by mass (%) or less of the hydrocarbon is preferably added per 100 parts by mass of sodium. When the seed crystal is a thin film substrate made of gallium nitride having a thickness of about 10 µm, the amount of the hydrocarbon is preferably 0.6 parts by mass (%) or less, more preferably 0.4 parts by mass (%) or less, per 100 parts by mass of sodium. However, the mass of the hydrocarbon for coating sodium may often exceed the above-described upper limit, depending on the shape of sodium or the thickness of the coating film of the hydrocarbon. In this case, a portion of the hydrocarbon is preferably removed in an adjustment step described below so as to obtain an appropriate amount of the hydrocarbon to be left in the crystal growth vessel 18.

Next, the crystal growth vessel 18 is placed in the closed pressure-resistant and heat-resistant vessel 15, and then the closed pressure-resistant and heat-resistant vessel 15, the valve 9 and the pipe 10 are assembled into the reaction vessel 17, which is then connected to the joint 7. Thereafter, the valve 9 is closed so as to prevent entry of atmosphere gas. These preliminary steps are preferably conducted in an atmosphere of inert gas (e.g., nitrogen gas, argon, etc.) whose oxygen concentration and water content are controlled, so as to suppress oxidation and hydroxylation of sodium. When sodium coated with a hydrocarbon is used, the gas atmosphere preferably has an oxygen concentration of 10 ppm or less and a water content (by volume) of 10 ppm or less. This is because oxidation and hydroxylation can be hindered for several hours.

Next, the reaction vessel 17 is removed from the inert gas atmosphere, the closed pressure-resistant and heat-resistant vessel 15 is placed in the heating apparatus 16, and the joint 7 is connected to the pipe 4. Thereafter, the valve 13 is opened, and the exhaust apparatus 14 is used to remove gas from the closed pressure-resistant and heat-resistant vessel 15 through the pipe 4, and optionally, perform an adjustment step of removing a portion of the hydrocarbon coating the sodium. The removal of a portion of the hydrocarbon to obtain an appropriate amount of remainder thereof may be, for example, carried out by adjusting the time length of the gas removal (exhaust time length). Since the exhaust time length varies from hydrocarbon to hydrocarbon, the exhaust time length is desirably determined by previously measuring the exhaust time length and the remaining amount of the hydrocarbon in the crystal growth vessel 18, or may be desirably determined based on the state of meltback or the state of a crystal after growth of a gallium nitride crystal. The hydrocarbon that coats the sodium may be solid or a mixture of solid and liquid at room temperature. When the vapor pressure is about 1000 Pa or less, the exhaust time may be considerably long. In this case, the closed pressure-resistant and heat-resistant vessel 15 is desirably heated while the gas is being removed. The heating temperature is preferably higher than room temperature and lower than 700° C. that is the crystal growth temperature. In view of the removal of water or the like attached by the time the reaction vessel 17 is assembled, the heating temperature is preferably higher than or equal to 100° C. and lower than or equal to 490° C. that is a temperature at which sodium and gallium form an alloy. Alternatively, a portion of the hydrocarbon coating the sodium can be removed, for example, by performing pressure application and pressurized cleaning purge with respect to the closed pressure-resistant and heat-resistant vessel 15 a predetermined number of times, or by providing an exhaust outlet (not shown) in the closed pressure-resistant and heat-resistant vessel 15 and causing inert gas, such as nitrogen gas or the like, to flow near the crystal growth vessel for a predetermined time. These methods can also be combined with heating of the closed pressure-resistant and heat-resistant vessel 15.

Next, the inside of the closed pressure-resistant and heat-resistant vessel 15 is pressurized with nitrogen-containing gas from the gas supply apparatus 1. Further, the closed pressure-resistant and heat-resistant vessel 15 is heated to a crystal growth temperature by the heating apparatus 16, thereby growing a gallium nitride crystal. Thereafter, when about 70% to 95% of gallium supplied as a material has been deposited as gallium nitride crystal, the seed crystal 20 is removed from the crystal growth vessel 18. In this case, gallium nitride crystal has been grown on the seed crystal 20.

(Embodiment 3)

A group-III element nitride crystal of the present invention is produced by the production method of the present invention described above.

This crystal preferably has an optical absorption coefficient of 10 cm$^{-1}$ or less with respect to light having a wavelength of 400 nm or more and 620 nm or less. The optical absorption coefficient is preferably 5 cm$^{-1}$ or less. Note that the lower limit of the optical absorption coefficient is a value exceeding zero.

The group-III element nitride crystal produced by the production method of the present invention may contain carbon. For example, the group-III element nitride crystal of the present invention may contain 5×10$^{17}$ (cm$^{-3}$) or less carbon atoms as a result of analysis by SIMS or the like.

In such a crystal, the group-III element is at least one element selected from Al, Ga and In. The group-III element nitride is preferably a compound that is represented by $Al_s Ga_t In_{(1\ 31\ s-t)}N$, where and $0\leq s\leq 1$, $0\leq t\leq 1$, and $s+t\leq 1$.

In particular, the group-III element is preferably gallium (Ga), and the group-III element nitride is preferably gallium nitride (GaN).

(Embodiment 4)

A substrate of the present invention includes a group-III element nitride crystal produced by the production method of the present invention described above.

A semiconductor device of the present invention is a semiconductor device in which a semiconductor layer is formed on the substrate.

The semiconductor layer is not particularly limited and may be any compound semiconductor, such as $Al_s Ga_t In_{(1-s-t)}N$ or the like. The semiconductor layer may have either a single-layer structure or a multilayer structure.

Examples of a semiconductor device formed using such a substrate include a laser diode (LD), a light emitting diode (LED) and the like.

Hereinafter, examples of the present invention will be described.

EXAMPLE 1

Gallium nitride crystals were produced using the apparatus of FIG. 1 under six sets of conditions in accordance with the description of Embodiment 1 above. Generation of the gallium nitride crystals was confirmed and the effect of suppressing nonuniform nucleation by addition of hydrocarbons was confirmed. Hereinafter, the production condition will be described.

(Production Conditions)

Seed crystal: gallium nitride thin film substrate
Dimension: 14 mm×15 mm gallium nitride thin film (film thickness: 10 μm)
Gas species: nitrogen gas (N$_2$), purity 5 N
Sodium: purity 99.9 to 99.99%
Gallium: purity 99.999 to 99.99999%
Hydrocarbons:
Liquid paraffin, specific gravity 0.82, boiling point: 170 to 340° C.
Solid paraffin, specific gravity 0.90, boiling point: 300° C. or more
Lamp oil, specific gravity 0.80, boiling point: 170° C. to 250° C.
Crucible used: Al$_2$O$_3$ (alumina), purity 99.9 to 99.99%
Growth time: 144 hours
Direction in which seed crystal is placed: vertical Table 1 below shows production conditions, i.e., the mass of sodium (Na), the mass of gallium (Ga), the type and mass of a hydrocarbon (HC), and a pressure and a temperature during growth. Note that production numbers 1 to 3 indicate comparative examples and production numbers 4 to 6 indicate Example 1. The results of production under the six sets of conditions are shown in Table 2 below. Note that measurement and evaluation in Table 2 were carried out by a method described below.

Generation of gallium nitride was confirmed by conducting element analysis (EDX) and photoluminescence measurement (PL). Element analysis was conducted by electron irradiation having an acceleration voltage of 15 kV while confirming the position of a sample using an electron microscope. A photoluminescence measurement was conducted by helium-cadmium laser irradiation at room temperature.

The amount of gallium nitride was measured by separately measuring the amount of a grown crystal and the amount of miscellaneous crystals grown using a method below. The crystal growth amount was obtained by subtracting the mass of a crystal seed alone previously measured from the mass of a seed crystal (including a crystal growth portion) after crystal growth. The amount of miscellaneous crystals was obtained by collecting crystals attached to the inner surface of the crystal growth vessel (crucible) and measuring the mass of the collected crystals.

The yield of gallium nitride (GaN) was obtained as the proportion of a mass corresponding to gallium of an amount (=crystal growth amount) grown on the seed crystal substrate with respect to the mass of gallium originally supplied.

An upper-lower film thickness ratio was obtained as a lower thickness/an upper thickness, where the upper thickness is the thickness of crystal growth at a portion located 5 mm from the upper end of the vertically arranged seed crystal and the lower thickness is the thickness of crystal growth at a portion located 5 mm from the lower end thereof.

TABLE 1

| Production No. | Na (g) | Ga (g) | Hydrocarbon (HC) | Hydrocarbon (mg) | HC/Na (wt %) | Growth temperature (° C.) | Growth pressure (MPa) |
|---|---|---|---|---|---|---|---|
| 1 | 2.3 | 2.0 | None | — | 0 | 850 | 3.4 |
| 2 | 2.3 | 2.0 | None | — | 0 | 860 | 3.6 |
| 3 | 2.3 | 2.0 | None | — | 0 | 870 | 3.8 |
| 4 | 2.3 | 2.0 | Lamp oil | 7.9 | 0.34 | 870 | 3.8 |
| 5 | 2.3 | 2.0 | Liquid paraffin | 8.1 | 0.35 | 870 | 3.8 |
| 6 | 2.3 | 2.0 | Solid paraffin | 9.0 | 0.39 | 870 | 3.8 |

TABLE 2

| Production No. | Confirmation of generation | Crystal growth amount (g) | Miscellaneous crystals growth amount (g) | GaN yield (%) | Upper-lower film thickness ratio (lower/upper) |
|---|---|---|---|---|---|
| 1 | Confirmed | 1.30 | 0.78 | 54 | 0.3 |
| 2 | Confirmed | 0.72 | 1.30 | 30 | 0.3 |
| 3 | Confirmed | 0.56 | 1.39 | 27 | 0.4 |
| 4 | Confirmed | 1.72 | 0.17 | 72 | 0.8 |
| 5 | Confirmed | 2.06 | 0.00 | 87 | 1.1 |
| 6 | Confirmed | 2.02 | 0.00 | 84 | 1.2 |

As shown in Table 2, for all production numbers 1 to 6, generation of gallium nitride was confirmed. For production numbers 1 to 3 in which no hydrocarbon was added, a large amount of miscellaneous crystals that were considered to be caused by nonuniform nucleation were grown in the crucible. Particularly, when the temperature and the pressure are high, the amount of miscellaneous crystals grown increases and the amount of crystal growth decreases. At the same time, the yield of gallium nitride decreases. On the other hand, for production numbers 4 to 6 in which a hydrocarbon was added, substantially no miscellaneous crystals were generated, i.e., the effect of suppressing nonuniform nucleation by addition of the hydrocarbon was confirmed. At the same time, the value of the upper-lower film thickness ratio was improved, and the effect of growth with more uniform film thicknesses was confirmed.

Figure 2A:
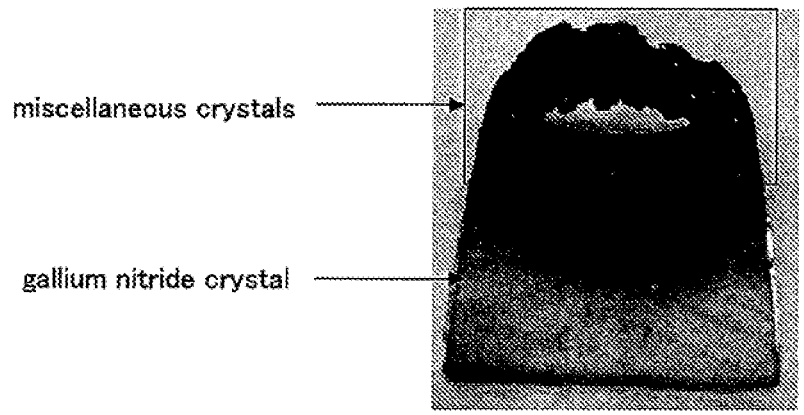
FIG. 2(a) shows a gallium nitride crystal for production number 3 of Example 1.
Figure 2B:
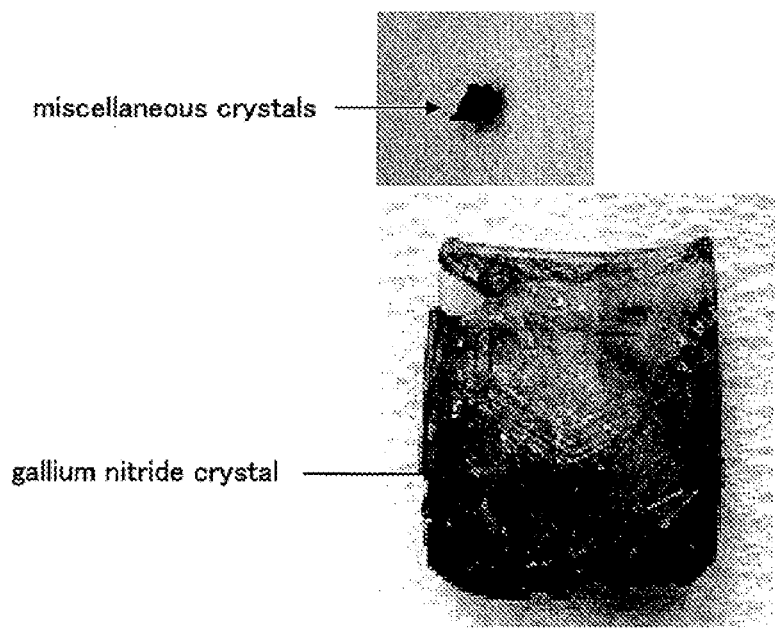
FIG. 2(b) shows a gallium nitride crystal for production number 5 of Example 1.

FIGS. 2(a) and 2(b) show photographs of gallium nitride crystals 30 of production numbers 3 and 5. As shown in FIG. 2(a), when no hydrocarbon was added, a considerably large amount of miscellaneous crystals 31 was generated. On the other hand, as shown in FIG. 2(b), when a hydrocarbon (lamp oil) was added, generation of the miscellaneous crystals 31 was suppressed.

EXAMPLE 2

Gallium nitride crystals were produced under five sets of conditions (production numbers 7 to 11) using the apparatus of FIG. 1 in a manner similar to that of Embodiment 1 described above, where a gallium nitride thin film was used as a seed crystal. Hereinafter, the production conditions will be described.

(Production Conditions)
Seed crystal: gallium nitride thin film substrate
Dimension: 14 mm×15 mm gallium nitride thin film (film thickness: 10 μm)
Gas species: nitrogen gas ($N_2$), purity 99.999%
Sodium: purity 99.9 to 99.99%
Gallium: purity 99.999 to 99.99999%
Hydrocarbon: Liquid paraffin, specific gravity 0.82, boiling point: 170 to 340° C.
Crucible used: $Al_2O_3$ (alumina), purity 99.9 to 99.99%
Growth time: 144 hours
Direction in which seed crystal is placed: vertical Table 3 described below shows production conditions, i.e., the mass of sodium (Na), the mass of gallium (Ga), the type and mass of a hydrocarbon (HC), and a pressure and a temperature during growth. The results of production under the five sets of conditions are also shown in Table 3 below. Here, confirmation of generation of gallium nitride, the amount of a grown crystal, the amount of miscellaneous crystals grown, and the yield of gallium were measured by a method similar to that of Example 1. A growth area ratio indicates the proportion of a grown gallium nitride crystal with respect to the area of a gallium nitride thin film as a seed crystal.

TABLE 3

| Production No. | Na (g) | Ga (g) | Hydrocarbon (HC) | HC (mg) | HC/Na (wt %) | Growth temperature (° C.) | Growth pressure (MPa) |
|---|---|---|---|---|---|---|---|
| 7 | 2.3 | 2.0 | Liquid paraffin | 0.41 | 0.018 | 865 | 3.6 |
| 8 | 2.3 | 2.0 | Liquid paraffin | 0.82 | 0.036 | 865 | 3.6 |
| 9 | 2.3 | 2.0 | Liquid paraffin | 4.06 | 0.18 | 865 | 3.6 |
| 10 | 2.3 | 2.0 | Liquid paraffin | 8.12 | 0.35 | 865 | 3.6 |
| 11 | 2.3 | 2.0 | Liquid paraffin | 16.2 | 0.70 | 865 | 3.6 |

TABLE 4

| Production No. | Confirmation of generation | Crystal growth amount (g) | Miscellaneous crystals growth amount (g) | GaN yield (%) | Growth area ratio (%) |
|---|---|---|---|---|---|
| 7 | Confirmed | 1.64 | 0.23 | 68 | 100 |
| 8 | Confirmed | 1.99 | 0.02 | 83 | 98 |
| 9 | Confirmed | 2.00 | 0.00 | 84 | 98 |
| 10 | Confirmed | 1.63 | 0.02 | 70 | 95 |
| 11 | Confirmed | 0.59 | 0.00 | 24 | 53 |

Initially, it was confirmed that a gallium nitride crystal was generated under all the sets of conditions (i.e., production numbers 7 to 11). Whereas the effect of suppressing generation of miscellaneous crystals by addition of a hydrocarbon was confirmed for all production numbers 7 to 11, generation of miscellaneous crystals was more effectively suppressed for production numbers 8 to 11 in which a larger amount of a hydrocarbon was added. According to these results, the amount of a hydrocarbon added is more preferably about 0.03% or more by mass with respect to the amount of sodium in terms of the effect of suppressing the occurrence of miscellaneous crystals. On the other hand, a satisfactory growth area ratio was obtained when the amount of a hydrocarbon added was less than 0.7 wt %, and therefore, it can be said that the melting during an initial state of crystal growth of a nitrogen gallium thin film (excessive meltback) was suppressed. If the amount of a hydrocarbon added was 0.35 wt % or less, the growth area ratio was 95% or more, and the gallium nitride thin film was substantially not melted. According to these results, when a gallium nitride thin film is used as a seed crystal, the appropriate range of the amount of a hydrocarbon added is more preferably 0.4% or less by mass with respect to the amount of sodium in terms of prevention of excessive meltback.

Figure 3A:
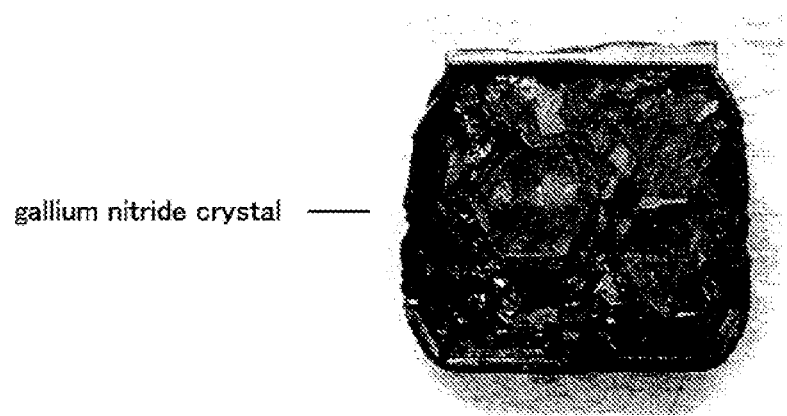
FIG. 3(a) shows a gallium nitride crystal for production number 9 of Example 2.
Figure 3B:
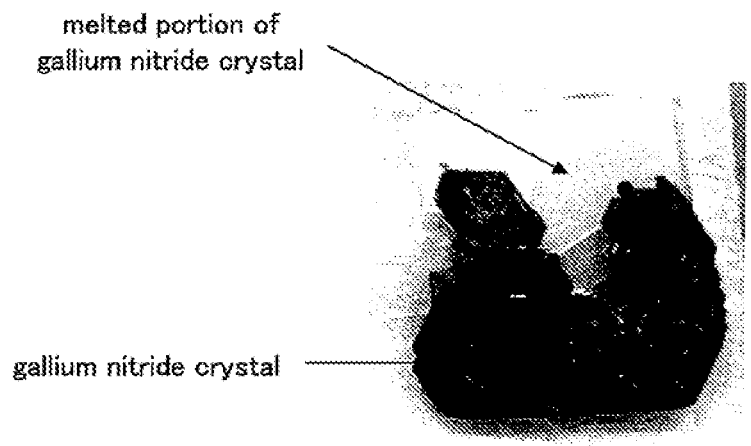
FIG. 3(b) shows a gallium nitride crystal for production number 11 of Example 2.

FIGS. 3(a) and 3(b) show photographs of gallium nitride crystals 32 for production numbers 9 and 11. FIG. 3(a) shows a case where a hydrocarbon for production number 9 was added in an amount of 0.18 wt %. In this case, gallium nitride was grown on an entire surface of the seed substrate, and there was substantially no excessive meltback of the gallium nitride thin film. FIG. 3(b) shows a case where a hydrocarbon for production number 11 was added in an amount of 0.7 wt %. In this case, the occurrence of miscellaneous crystals was suppressed, and the area ratio of a melted portion 33 of the grown gallium nitride thin film with respect to the seed substrate was about 53%.

EXAMPLE 3

Gallium nitride crystals were produced under two sets of conditions (production numbers 12 and 13) shown in Table 5 using the apparatus of FIG. 1 in a manner similar to that of Embodiment 2 described above. Hereinafter, the production conditions will be described.

(Production conditions)
Seed crystal: gallium nitride thin film substrate
Dimension: 14 mm×15 mm gallium nitride thin film (film thickness: 10 μm)
Gas species: nitrogen gas ($N_2$), purity 99.999%
Sodium: purity 99.9 to 99.99%
Gallium: purity 99.999 to 99.99999%
Hydrocarbon: Lamp oil, boiling point: 150° C. to 250° C.
Crucible used: $Al_2O_3$ (alumina), purity 99.9 to 99.99%
Direction in which seed crystal is placed: vertical
Growth time: 144 hours Conditions, such as sodium, gallium, the type of a hydrocarbon that coats sodium, and an exhaust time and a heating time of the step of removing a portion of the hydrocarbon, are shown in Table 5 below. The results from these two sets of production conditions are shown in Table 6. Confirmation of generation of gallium nitride, the amount of a grown crystal, the amount of miscellaneous crystals grown, and the yield of gallium are measured by a method similar to that of Example 1.

TABLE 5

| Production No. | Na (g) | Ga (g) | Hydrocarbon | Exhaust time (min) | Heating temperature (° C.) | Growth temperature (° C.) | Growth pressure (MPa) |
|---|---|---|---|---|---|---|---|
| 12 | 2.3 | 2.0 | Lamp oil | 120 | 25° C. | 865 | 3.6 |
| 13 | 2.3 | 2.0 | Lamp oil | 20 | 120° C. | 865 | 3.6 |

TABLE 6

| Production No. | Confirmation of generation | Crystal growth amount (g) | Miscellaneous crystals growth amount (g) | GaN yield (%) | Growth area ratio (%) |
|---|---|---|---|---|---|
| 12 | Confirmed | 1.71 | 0.12 | 71 | 82 |
| 13 | Confirmed | 1.81 | 0.02 | 75 | 92 |

Firstly, as shown in Table 6, a gallium nitride crystal was confirmed for all production numbers 12 and 13. The amount of miscellaneous crystals grown was 0.12 g or less for all production numbers 12 and 13, which was smaller than the amount of miscellaneous crystals grown when no hydrocarbon was added in Example 1, so that the effect of suppressing nonuniform nucleation was confirmed. Also, since sodium was coated with a hydrocarbon (lamp oil), oxidation of sodium or the like was prevented, so that the resultant crystal had high quality.

Figure 4:
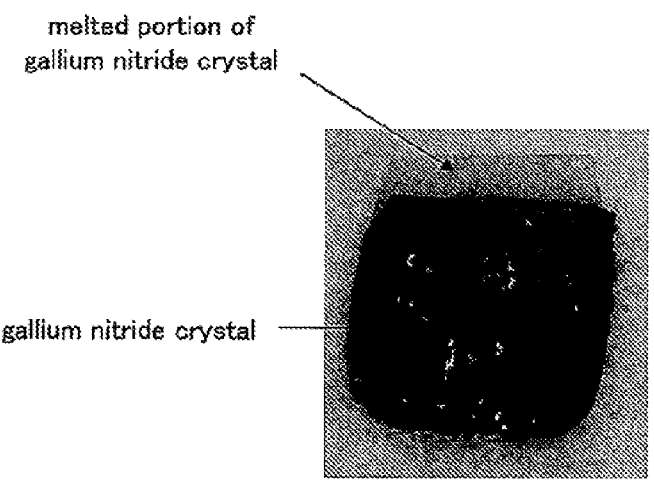
FIG. 4 shows a gallium nitride crystal for production number 12 of Example 3.

FIG. 4 shows a photograph for production number 12. For production number 12, sodium was coated with a lamp oil, and gas was removed at 25° C. for 120 minutes in an adjustment step. A gallium nitride crystal was satisfactorily grown on substantially an entire surface of the gallium nitride thin film at a growth area ratio of 82%, though a portion of the gallium nitride thin film was melted (melted portion 33). For production number 13 (not shown), sodium was coated with a lamp oil, and gas was removed at 120° C. for 20 minutes. In this case, the growth area was 92%, i.e., more satisfactory growth.

EXAMPLE 4

Figure 5:
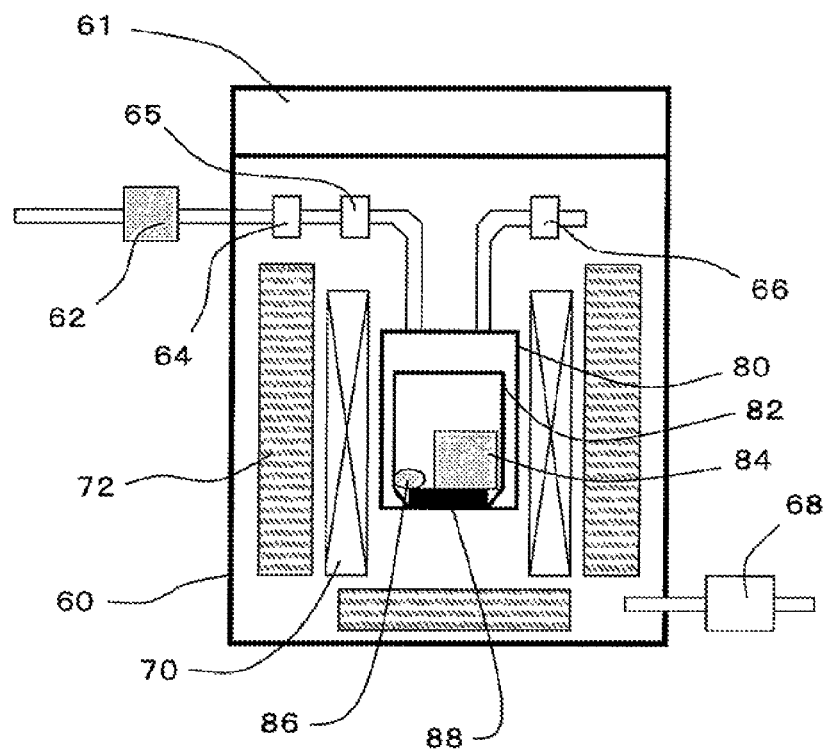
FIG. 5 is a diagram showing an exemplary configuration of a production apparatus used in Example 4.

A gallium nitride crystal was produced using the apparatus of FIG. 5 by the method of Embodiment 2 described above. The production conditions are described below, and the results are shown in Table 7 below. Note that, in Table 7, "With carbon corting" refers to this example and "Without carbon coating" refers to a comparative example.

(Production conditions)
Seed crystal: gallium nitride thin film substrate
Dimension: 2-inch gallium nitride thin film (film thickness: 10 μm)
Gas species: nitrogen gas ($N_2$), purity 99.999%
Sodium: purity 99.9 to 99.99%
Gallium: purity 99.999 to 99.99999%
Hydrocarbons:
  Lamp oil: boiling point 150° C. to 250° C. (for coating sodium)
  Liquid paraffin, boiling point: 170° C. to 340° C. (for coating sodium)
Crucible used: $Al_2O_3$ (alumina), purity 99.9 to 99.99%
Direction in which seed crystal is placed: fixed to bottom of crucible
Growth time: 144 hours A reaction vessel 80, a crystal growth vessel (crucible) 82, gallium 86, and sodium 84 were placed in a glove box (not shown), followed by charging of materials. Initially, a seed 88 was set in the crystal growth vessel 82. Next, the sodium 84 and the gallium 86 were weighed and then placed in the crucible 82. The sodium 84 was coated with a hydrocarbon (a lamp oil or a liquid paraffin) as described in Embodiment 2 after removal of oxides or impurities on the surface, and was then placed in the crucible 82. Thereafter, the crucible 82 in which the materials were set in the glove box was set in the reaction vessel 80. Also, in the glove box, a valve 65 at a gas inlet side and a valve 66 at a gas outlet side were closed so that the sodium 84 in the crucible was not oxidized even if the reaction vessel was removed into the air. Further, a high-pressure chamber lid 61 was opened, and the reaction vessel was set in the crystal growth apparatus via a joint 64. Thereafter, reaction gas (here, nitrogen gas) was caused to flow via a gas flow rate adjuster 62. In this case, the valve 65 and the valve 66 were opened to allow the nitrogen gas to flow into the reaction vessel. In this situation, the high-pressure chamber lid 61 was closed and the high-pressure chamber 60 was evacuated. When a predetermined degree of vacuum was reached, the gas flow rate adjuster 62 was temporarily closed and the chamber 60 was evacuated to high vacuum. Thereafter, evacuation was performed while causing the reaction gas to flow again, thereby removing a desired amount of the hydrocarbon (a lamp oil, a liquid paraffin, etc.) in the crucible in the reaction vessel.

Although a hydrocarbon, such as a lamp oil or the like, that is relatively easily evaporated, can be removed by gas flow or evacuation even at room temperature, a time required to evaporate the hydrocarbon can be effectively reduced by holding the hydrocarbon, for example, at about 100 to 200° C. for about 30 min to 2 hr while causing nitrogen gas to flow. When the hydrocarbon is a liquid paraffin or the like, which has a high boiling point, the hydrocarbon may not be sufficiently removed at room temperature by evacuation while causing nitrogen gas to flow. In this case, the reaction vessel may be temporarily held at 200° C. to 300° C. (e.g., 1 to 2 hours), and the flow of nitrogen gas may be further continued, thereby making it possible to adjust the amount of the hydrocarbon remaining in the crucible. Note that, when completely no hydrocarbon is used, the sodium 84 may react with oxygen or water due to an influence of a slight amount of a residual impurity or the like in a pipe or the like remaining in the joint 64 and the valve 65.

After leaving an appropriate amount of the hydrocarbon, the crystal growth temperature and the growth pressure were adjusted into predetermined values. Conditions for crystal growth used herein are a growth temperature of 850 to 870° C. and a growth pressure of 3.4 to 3.8 MPa.

Figure 6A:
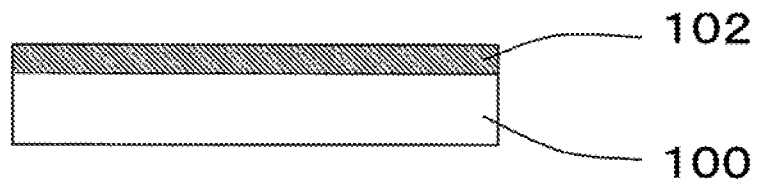
FIGS. 6(a) to 6(c) are schematic diagrams showing exemplary states of a substrate and a crystal of Example 4.

As shown in FIG. 6(a), a crystal having a seed layer 102 of about 10 μm that was vapor-grown on a 2-inch holding substrate 100 (here, sapphire was used) was use as a seed.

TABLE 7

| | Film thickness (mm) | Presence of miscellaneous crystals | Coloration | Yield |
|---|---|---|---|---|
| Without hydrocarbon coating | 1 to 1.5 | Yes | Yes | 2/5 |
| With hydrocarbon coating | 2 to 2.5 | Substantially no | Substantially no | 4/5 |

As shown in Table 7, under the conditions that a hydrocarbon was added, a grown crystal 104 having a thickness of about 2 to 2.5 mm that was LPE-grown on a seed was able to be grown with high reproducibility. On the other hand, when no hydrocarbon was used for coating of sodium, the probability (yield) of crystal growth was lower than when a hydrocarbon was used, and the film thickness that was able to be achieved was as thin as 1 to 1.5 mm. This is a main reason why nonuniform nucleation occurs (so-called occurrence of miscellaneous crystals) on a wall of the crystal growth vessel other than the seed crystal even if growth is carried out under the same conditions. Further, when a surface of sodium was coated with a hydrocarbon, a crystal with substantially no coloration was able to be grown with high reproducibility. On the other hand, when no hydrocarbon was used, a crystal with deep coloration was frequently observed. In some cases, a case where only a black thin film crystal was obtained was frequently observed.

As described above, when sodium was coated with a hydrocarbon, not only miscellaneous crystals occurred less, but also the yield of crystal growth was able to be improved and a highly transparent crystal was able to be grown with high reproducibility. Moreover, when sodium is coated with a hydrocarbon, the amount of the hydrocarbon tends to be larger than the optimal value of Example 1. Therefore, a portion of the hydrocarbon was removed by evaporation, so that a GaN crystal was able to be grown on an entire surface of a 2-inch seed crystal without excessive melting (excessive meltback) of the seed layer.

Figure 6B:
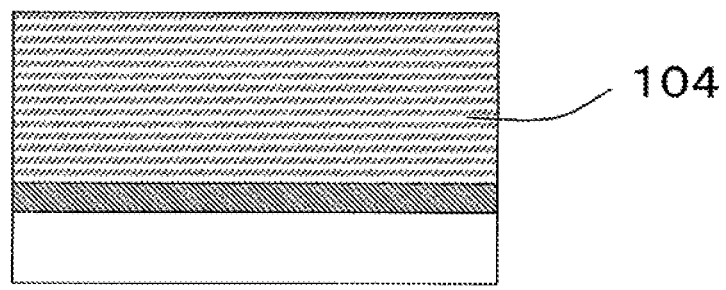
Figure 6C:
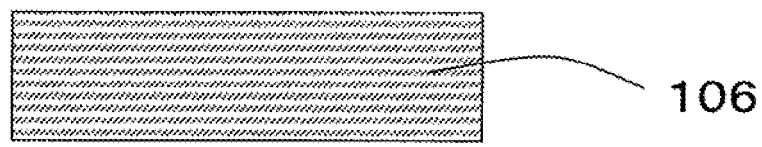

Next, the holding substrate 100 was removed by polishing, and thereafter, a growth surface of the LPE-grown crystal 104 (FIG. 6(b)) was mechanically or chemical-mechanically polished, so that a 2-inch self-sustaining GaN substrate 106 (FIG. 6(c)) was able to be obtained.

EXAMPLE 5

Figure 7A:
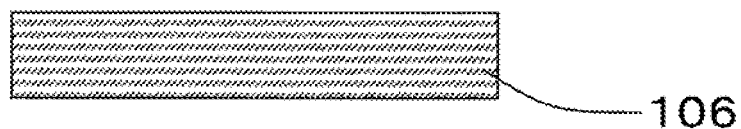
FIGS. 7(a) to 7(c) are schematic diagrams showing exemplary states of a substrate and a crystal of Example 5.
Figure 7B:
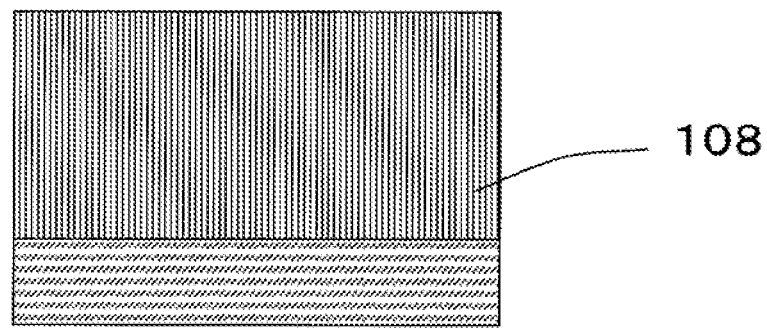
Figure 7C:
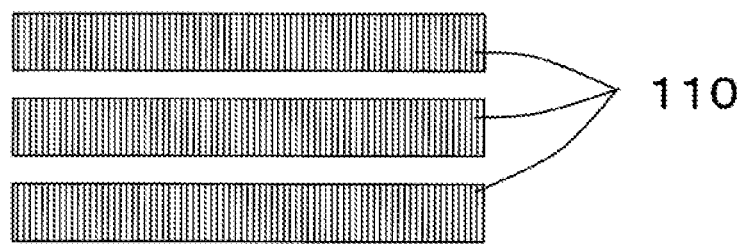

As Example 5, a case where a large number of self-sustaining GaN substrates are obtained using an LPE-grown substrate 106 as a seed will be described with reference to FIG. 7. As shown in FIGS. 7(a) and 7(b), a GaN crystal 108 of about 4 mm was able to be grown on the seed crystal 106 under the same growth conditions as those of Example 4, except that the growth time was two times longer than that of Example 4. Here, as in Example 4, by adding a hydrocarbon, growth was able to be carried out with substantially no occurrence of miscellaneous crystals, even though the growth time was as long as 288 hours.

A seed portion of the obtained crystal of FIG. 7(b) was removed. The crystal was cut into slices each having a thickness of about 1 mm using a wire saw, followed by polishing of the rear and front surfaces thereof. Thereby, crystals 110 each having a thickness of 400 μm (FIG. 7(c)) were able to be extracted from about 2-inch crystal. These crystals were obtained from an LPE-grown crystal as a seed. Therefore, a GaN self-sustaining crystal substrate having excellent crystallinity, an EPD density of $1 \times 10^4$ to $5 \times 10^5$ $(cm^{-2})$, and a low dislocation degree was able to be obtained. Also, the transparency of the crystal was satisfactory and the coloration of the crystal was substantially not observed. In this case, the optical absorption coefficient with respect to a wavelength of 400 to 620 nm was able to be 10 $cm^{-1}$. Therefore, by coating sodium with a hydrocarbon, the yield of crystal growth and the reproducibility of the transparency can be caused to be satisfactory in addition to the effect of suppressing miscellaneous crystals by the hydrocarbon. The miscellaneous-crystals suppression effect was more advantageous, particularly when long-time growth is required for large thickness or bulk growth. Although a dopant was not added in Examples 1 to 5, an n-type dopant (Si, O, Ge or Sn) or a p-type dopant (Mg, Sr, Ba or Zn) may be added in an appropriate amount as described above.

INDUSTRIAL APPLICABILITY

According to the present invention, suppression of miscellaneous crystals, an improvement in reproducibility, and a reduction in coloration can be carried out during the growth of a group-III element nitride crystal using a flux made of an alkali metal.

The invention claimed is:
1. A method for producing a group-III element nitride crystal, comprising the steps of:
placing a group-III element, an alkali metal, and a seed crystal of group-III element nitride in a crystal growth vessel;
pressurizing and heating the crystal growth vessel in an atmosphere of nitrogen containing gas;
causing the group-III element and nitrogen to react with each other in a melt of the group-III element, the alkali metal and the nitrogen so that a group-III element nitride crystal is grown using the seed crystal as a nucleus; and
adding a hydrocarbon having a boiling point higher than a melting point of the alkali metal is added before the pressurization and heating of the crystal growth vessel.
2. The method according to claim 1, wherein
the alkali metal is coated with a hydrocarbon, and the coated alkali metal is added to the crystal growth vessel.
3. The method according to claim 1, further comprising:
adjusting an amount of the hydrocarbon in the crystal growth vessel.
4. The method according to claim 1, wherein
the hydrocarbon added in the crystal growth vessel is in at least either of a solid state and a liquid state at room temperature.
5. The method according to claim 1, wherein
the hydrocarbon has a boiling point of 150° C. or more.

6. The method according to claim 1, wherein
the hydrocarbon is at least one compound selected from the group consisting of chain saturated hydrocarbons, chain unsaturated hydrocarbons, alicyclic hydrocarbons and aromatic hydrocarbons.

7. The method according to claim 1, wherein
an amount of the hydrocarbon added is 0.03 parts by mass or more per 100 parts by mass of the alkali metal.

8. The method according to claim 1, wherein
when the seed crystal is a group-III element nitride single crystal, an amount of the hydrocarbon added is one part by mass or less per 100 parts by mass of the alkali metal.

9. The method according to claim 1, wherein
the seed crystal is a thin film of group-III element nitride formed on a substrate, and an amount of the hydrocarbon added is 0.6 parts by mass or less per 100 parts by mass of the alkali metal.

10. The method according to claim 1, wherein
the group-III element is at least one element selected from Al, Ga and In, and
the group-III element nitride is a compound represented by $Al_sGa_tIn_{(1-s-t)}N$, where $0 \leq s \leq 1$, $0 \leq t \leq 1$, and $s+t \leq 1$.

11. The method according to claim 1, wherein
the group-III element is Ga,
the group-III element nitride is GaN, and
the alkali metal includes Na.

12. The method according to claim 11, wherein
the hydrocarbon has a boiling point higher than the melting point of Na.

* * * * *